(12) United States Patent
Ito et al.

(10) Patent No.: US 9,172,017 B2
(45) Date of Patent: Oct. 27, 2015

(54) SEMICONDUCTOR DEVICE AND METHOD FOR MANUFACTURING THE SAME

(71) Applicant: Kabushiki Kaisha Toshiba, Tokyo (JP)

(72) Inventors: Toshihide Ito, Tokyo (JP); Hiroshi Katsuno, Tokyo (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 170 days.

(21) Appl. No.: 13/780,486

(22) Filed: Feb. 28, 2013

(65) Prior Publication Data

US 2014/0077248 A1    Mar. 20, 2014

(30) Foreign Application Priority Data

Sep. 20, 2012    (JP) ................. 2012-207627

(51) Int. Cl.
| | |
|---|---|
| H01L 21/00 | (2006.01) |
| H01L 33/62 | (2010.01) |
| H01L 33/40 | (2010.01) |
| H01L 33/32 | (2010.01) |
| H01S 5/042 | (2006.01) |
| H01S 5/323 | (2006.01) |

(52) U.S. Cl.
CPC .............. *H01L 33/62* (2013.01); *H01L 33/40* (2013.01); *H01L 33/32* (2013.01); *H01L 2924/0002* (2013.01); *H01S 5/0425* (2013.01); *H01S 5/32341* (2013.01)

(58) Field of Classification Search
CPC . H01L 36/62; H01L 33/40; H01L 2924/0002; H01L 33/32; H01S 5/3234; H01S 5/0425
USPC ............................................. 257/76, 98–99
See application file for complete search history.

(56) References Cited

U.S. PATENT DOCUMENTS

| | | | |
|---|---|---|---|
| 2007/0170415 A1 | 7/2007 | Maruta | |
| 2008/0123711 A1 | 5/2008 | Chua et al. | |
| 2008/0284315 A1* | 11/2008 | Tasumi et al. ................ | 313/503 |
| 2008/0305570 A1* | 12/2008 | Imai ............................... | 438/47 |
| 2009/0263922 A1* | 10/2009 | Kamei .......................... | 438/29 |
| 2011/0114966 A1 | 5/2011 | Liu et al. | |
| 2012/0217531 A1* | 8/2012 | Katsuno et al. ................ | 257/99 |
| 2012/0235168 A1* | 9/2012 | Katsuno et al. ................ | 257/88 |

(Continued)

FOREIGN PATENT DOCUMENTS

| | | |
|---|---|---|
| JP | 08-306958 A | 11/1996 |
| JP | 2005-197473 A | 7/2005 |
| JP | 2006-59933 | 3/2006 |
| JP | 2008-066727 A | 3/2008 |

(Continued)

OTHER PUBLICATIONS

Office Action issued Aug. 5, 2014 in Japanese Patent Application No. 2012-207627 (with English language translation).

*Primary Examiner* — Laura Menz
(74) *Attorney, Agent, or Firm* — Oblon, McClelland, Maier & Neustadt, L.L.P.

(57) ABSTRACT

According to one embodiment, a semiconductor device includes a first semiconductor layer of an n type including a nitride semiconductor, a first metal layer of an alloy containing Al and Au, and a second metal layer. The first metal layer is in contact with the first semiconductor layer. The second metal layer is in contact with the first metal layer. The second metal layer includes a metal different from Al. The first metal layer is disposed between the second metal layer and the first semiconductor layer.

16 Claims, 9 Drawing Sheets

(56) References Cited

U.S. PATENT DOCUMENTS

| | | |
|---|---|---|
| 2012/0292631 A1* | 11/2012 | Katsuno et al. ............... 257/76 |
| 2013/0087806 A1* | 4/2013 | Ito et al. ...................... 257/76 |
| 2013/0193443 A1* | 8/2013 | Ito et al. ...................... 257/76 |
| 2013/0234182 A1* | 9/2013 | Katsuno et al. ............... 257/98 |
| 2014/0077248 A1* | 3/2014 | Ito et al. ...................... 257/99 |

FOREIGN PATENT DOCUMENTS

| | | |
|---|---|---|
| JP | 2012-089801 A | 5/2012 |
| JP | 4940363 B1 | 5/2012 |
| JP | 4989773 B1 | 8/2012 |
| JP | 2013-508994 A | 3/2013 |
| WO | WO 2011/055202 A2 | 5/2011 |

* cited by examiner

SEMICONDUCTOR DEVICE AND METHOD FOR MANUFACTURING THE SAME

CROSS-REFERENCE TO RELATED APPLICATIONS

This application is based upon and claims the benefit of priority from the prior Japanese Patent Application No. 2012-207627, filed on Sep. 20, 2012; the entire contents of which are incorporated herein by reference.

FIELD

Embodiments described herein relate generally to a semiconductor device and a method for manufacturing the same.

BACKGROUND

In semiconductor devices such as semiconductor light emitting devices such as LEDs (light emitting diodes), there is a configuration in which a stacked structure of aluminum (Al) and a different kind of metal is used as an n-side electrode (an n electrode). In the configuration using Al, due to a heat treatment process etc., the characteristics may become unstable; for example, the contact resistance between the electrode and a semiconductor layer may be increased.

DETAILED DESCRIPTION

Figure 1:
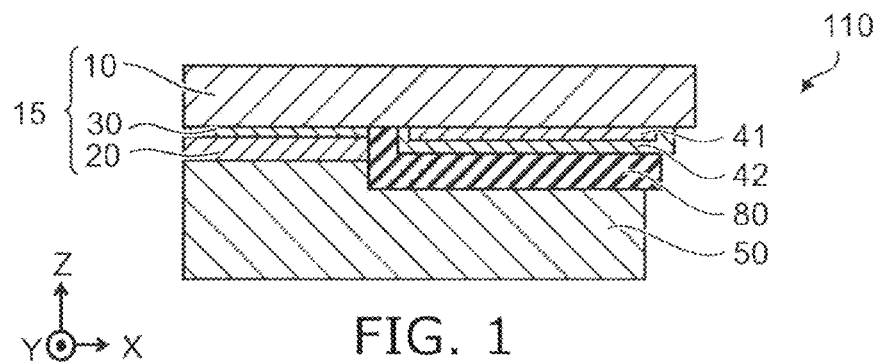
FIG. 1 is a schematic cross-sectional view showing a semiconductor device according to the first embodiment.

According to one embodiment, a semiconductor device includes a first semiconductor layer of an n type including a nitride semiconductor, a first metal layer of an alloy containing Al and Au, and a second metal layer. The first metal layer is in contact with the first semiconductor layer. The second metal layer is in contact with the first metal layer. The second metal layer includes a metal different from Al. The first metal layer is disposed between the second metal layer and the first semiconductor layer.

According to one embodiment, a method for manufacturing a semiconductor device is provided. The method includes forming a layer including Al and Au in contact with a first semiconductor layer of an n type including a nitride semiconductor. The method includes performing heat treatment in an inert gas atmosphere on the first semiconductor layer and the layer including the Al and Au to form a first metal layer including an alloy including Al and Au. The method includes forming a second metal layer including a metal different from Al on the first metal layer. The method includes forming an insulating layer at a temperature of 350° C. or more on the second metal layer.

Various embodiments will be described hereinafter with reference to the accompanying drawings.

The drawings are schematic or conceptual; and the relationships between the thickness and width of portions, the proportions of sizes among portions, etc. are not necessarily the same as the actual values thereof. Further, the dimensions and proportions may be illustrated differently among drawings, even for identical portions.

In the specification of this application and the drawings, components similar to those described in regard to a drawing thereinabove are marked with the same reference numerals, and a detailed description is omitted as appropriate.

First Embodiment

A first embodiment relates to a semiconductor device.

The semiconductor device includes, for example, a semiconductor light emitting device, a semiconductor light receiving device, an electronic device, etc. The semiconductor light emitting device includes, for example, a light emitting diode (LED), a laser diode (LD), etc. The semiconductor light receiving device includes photodiode (PD) etc. The electronic device includes, for example, a high electron mobility transistor (HEMT), a hetero-junction bipolar transistor (HBT), a field effect transistor (FET), a Schottky barrier diode (SBD), etc.

FIG. 1 is a schematic cross-sectional view illustrating a semiconductor device according to the first embodiment.

As shown in FIG. 1, a semiconductor device 110 according to the embodiment includes an n-type first semiconductor layer 10, a first metal layer 41, and a second metal layer 42.

The first semiconductor layer 10 includes a nitride semiconductor. GaN or the like, for example, is used for the first semiconductor layer 10.

The first metal layer 41 is in contact with the first semiconductor layer 10. An alloy is used for the first metal layer 41. The alloy includes Al and Au. As described later, the alloy may further include Ni.

The second metal layer 42 is in contact with the first metal layer 41. The first metal layer 41 is disposed between the second metal layer 42 and the first semiconductor layer 10. That is, the first metal layer 41 is provided on the first semiconductor layer 10, and the second metal layer 42 is provided on the first metal layer 41. The second metal layer 42 includes a metal different from Al. For example, the second metal layer 42 includes Pt. As described later, the second metal layer 42 includes, for example, a Pt layer.

In the case where, for example, an Al layer (not an alloy including Al an Au) is provided between the second metal layer 42 and the first semiconductor layer 10, a metal different from Al included in the second metal layer 42 is introduced into the Al layer due to various heat treatments. Alternatively, Al atoms of the Al layer are introduced into the second metal layer 42. The interfacial state between the Al layer and the first semiconductor layer 10 is changed, for example. Thereby, for example, the contact resistance between the Al layer and the first semiconductor layer 10 is increased.

In contrast, in the embodiment, the first metal layer 41 of an alloy including Al and Au is provided between the second metal layer 42 and the first semiconductor layer 10; thereby, the increase in the contact resistance like the above can be suppressed. Examples of such characteristics are described later.

As illustrated in FIG. 1, the semiconductor device 110 further includes a p-type second semiconductor layer 20 and a light emitting layer 30. The second semiconductor layer 20 is away from the first semiconductor layer 10, and includes a nitride semiconductor. The light emitting layer 30 is provided between the first semiconductor layer 10 and the second semiconductor layer 20. A nitride semiconductor is used for the light emitting layer 30. The semiconductor device 110 is an example of the semiconductor light emitting device. The first semiconductor layer 10, the light emitting layer 30, and the second semiconductor layer 20 are included in a stacked body 15.

In this example, the semiconductor device 110 further includes an insulating layer 80. The insulating layer 80 covers at least one of the first metal layer 41 and the second metal layer 42.

In this example, the first metal layer 41 is covered with the second metal layer 42. The insulating layer 80 covers the second metal layer 42.

In this example, the semiconductor device 110 further includes a counter conductive layer 50. The counter conductive layer 50 is electrically connected to the second semiconductor layer 20. At least part of the insulating layer 80 is disposed between the counter conductive layer 50 and the second metal layer 42. The insulating layer 80 electrically insulates the counter conductive layer 50 and the second metal layer 42.

Silicon oxide, for example, is used for the insulating layer 80. Thereby, high insulation between the counter conductive layer 50 and the second metal layer 42 is obtained. To obtain high insulation in the insulating layer 80, the formation temperature of the insulating layer 80 is set to a prescribed temperature or more. The formation temperature of the insulating layer 80 includes, for example, the temperature in the film-formation of the insulating layer 80 and the temperature of heat treatment (e.g. annealing) after the film-formation. The formation temperature of the insulating layer 80 is, for example, not less than 350° C. and not more than 650° C. By setting the formation temperature of the insulating layer 80 to 350° C. or more, the film quality of the insulating layer 80 is improved and high insulation is obtained. By setting the formation temperature of the insulating layer 80 to 350° C. or more, the adhesion between the insulating layer 80 and the second metal layer 42 becomes good. If the temperature of the insulating layer 80 exceeds 650° C., for example, the first metal layer 41 may be degraded.

In the case where silicon oxide (or silicon oxynitride) is used as the insulating layer 80, the refractive index of the insulating layer 80 is preferably not less than 1.45 and less than 2.00. When the refractive index of the insulating layer 80 is 1.45 or more, the insulating layer 80 is dense and high insulation is obtained.

The direction from the first metal layer 41 toward the first semiconductor layer 10 is taken as the Z-axis direction (the stacking direction). One direction perpendicular to the Z-axis direction is taken as the X-axis direction. The direction perpendicular to the Z-axis direction and the X-axis direction is taken as the Y-axis direction. The first semiconductor layer 10, the light emitting layer 30, and the second semiconductor layer 20 are stacked along the stacking direction.

In the specification of this application, "stack" includes not only the state of being stacked in contact with one another but also the state of being stacked via other layers.

An example of the light emitting layer 30 will now be described.

Figure 2:
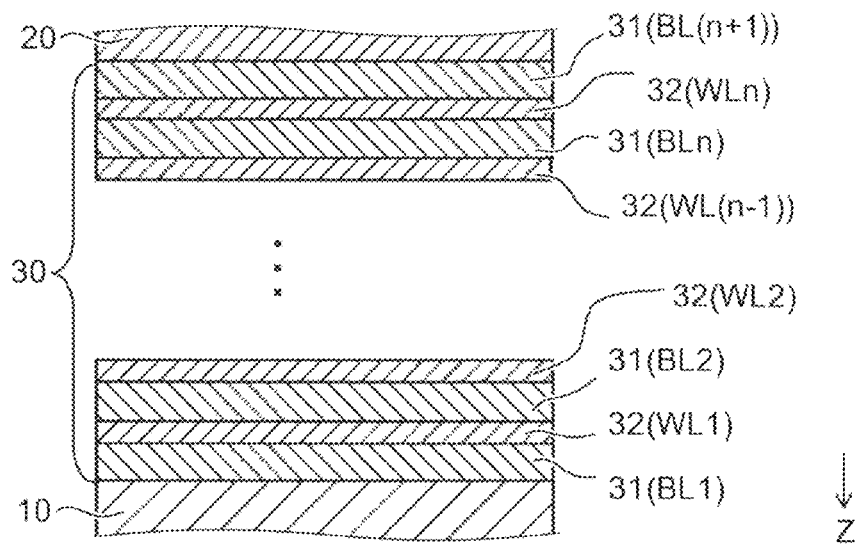
FIG. 2 is a schematic cross-sectional view showing part of a semiconductor device according to the first embodiment.

FIG. 2 is a schematic cross-sectional view illustrating part of a semiconductor device according to the first embodiment.

As shown in FIG. 2, the light emitting layer 30 includes a plurality of barrier layers 31 and a well layer 32 provided between barrier layers 31. For example, a plurality of barrier layers 31 and a plurality of well layers 32 are alternately stacked along the Z-axis.

The well layer 32 includes $In_{x1}Ga_{1-x1}N$ ($0<x1<1$). The barrier layer 31 includes GaN. That is, the well layer 32 includes In, and the barrier layer 31 substantially does not include In. The band gap energy in the barrier layer 31 is larger than the band gap energy in the well layer 32.

The light emitting layer 30 may have a single quantum well (SQW) configuration. In this case, the light emitting layer 30 includes two barrier layers 31 and a well layer 32 provided between the barrier layers 31. Alternatively, the light emitting layer 30 may have a multi quantum well (MQW) configuration. In this case, the light emitting layer 30 includes three or more barrier layers 31 and well layers 32 provided individually between barrier layers 31.

That is, the light emitting layer 30 includes (n+1) barrier layers 31 and n well layers 32 (n being an integer of 8 or more). The (i+1)-th barrier layer BL(i+1) is disposed between the i-th barrier layer BLi and the second semiconductor layer 20 (i being an integer of not less than 1 and not more than (n−1)). The (i+1)-th well layer WL(i+1) is disposed between the i-th well layer WLi and the second semiconductor layer 20. The 1st barrier layer BL1 is provided between the first semiconductor layer 10 and the 1st well layer WL1. The n-th well layer WLn is provided between the n-th barrier layer BLn and the (n+1)-th barrier layer BL(n+1). The (n+1)-th barrier layer BL(n+1) is provided between the n-th well layer WLn and the second semiconductor layer 20.

The peak wavelength of the light (emission light) emitted from the light emitting layer 30 is, for example, not less than 360 nanometers (nm) and not more than 650 nm. However, the peak wavelength is arbitrary in the embodiment.

A GaN layer including an n-type impurity, for example, is used as the first semiconductor layer 10. At least one of Si, Ge, Te, and Sn may be used as the n-type impurity. The first semiconductor layer 10 includes, for example, an n-side contact layer.

A GaN layer including a p-type impurity, for example, is used as the second semiconductor layer 20. At least one of Mg, Zn, and C may be used as the p-type impurity. The second semiconductor layer 20 includes, for example, a p-side contact layer.

Figure 3:
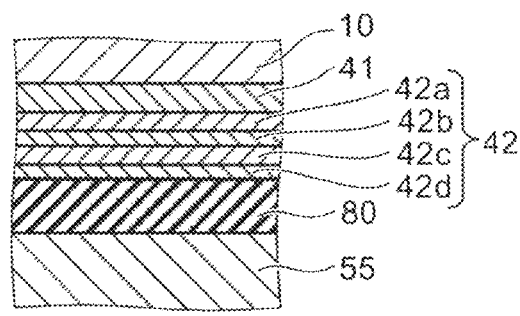
FIG. 3 is a schematic cross-sectional view showing part of a semiconductor device according to the first embodiment.

FIG. 3 is a schematic cross-sectional view illustrating part of a semiconductor device according to the first embodiment.

As shown in FIG. 3, the second metal layer 42 includes a first Ti layer 42a, a Pt layer 42b, and an Au layer 42c. The Pt layer 42b is provided between the Au layer 42c and the first metal layer 41, and is in contact with the Au layer 42c. The first Ti layer 42a is provided between the Pt layer 42b and the first metal layer 41, and is in contact with the Pt layer 42b and the first metal layer 41.

That is, the first Ti layer 42a is provided on and in contact with the first metal layer 41. The Pt layer 42b is provided on and in contact with the first Ti layer 42a. The Au layer 42c is provided on and in contact with the Pt layer 42b.

In this example, the second metal layer 42 further includes a second Ti layer 42d. The second Ti layer 42d is in contact with the Au layer 42c. The Au layer 42c is disposed between the second Ti layer 42d and the Pt layer 42b. That is, the second Ti layer 42d is provided on and in contact with the Au layer 42c.

The first Ti layer 42a functions as, for example, an adhesion layer. The Pt layer 42b functions as a barrier layer between the first Ti layer 42a and the Au layer 42c. By using the Au layer 42c, high electrical conductivity is obtained. By using the second Ti layer 42d, for example, the adhesion between the Au layer 42c and the insulating layer 80 is improved.

The thickness of the second metal layer 42 is preferably not less than 100 nm and not more than 10 µm. It is more preferably 1 µm or less. If the thickness of the second metal layer 42 is less than 100 nm, for example, current spread is not satisfactory. If the thickness of the second metal layer 42 exceeds 10 µm, for example, bonding is difficult in subsequent processes.

FIG. 4A to FIG. 4E are schematic cross-sectional views in order of the processes, illustrating a method for manufacturing a semiconductor device according to the first embodiment.

Figure 4A:
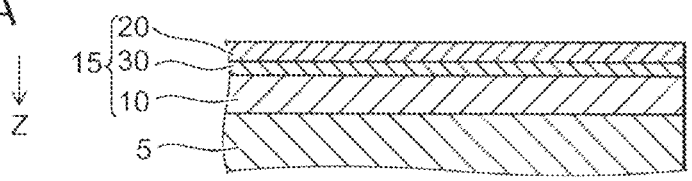
FIG. 4A to FIG. 4E are schematic cross-sectional views in order of the processes, showing a method for manufacturing a semiconductor device according to the first embodiment.

As shown in FIG. 4A, the stacked body 15 is provided on a growth substrate 5. The first semiconductor layer 10 is provided between the growth substrate 5 and the second semiconductor layer 20, for example. The light emitting layer 30 is provided between the first semiconductor layer 10 and the second semiconductor layer 20. One of silicon, sapphire, GaN, and SiC, for example, is used for the growth substrate 5.

Figure 4B:
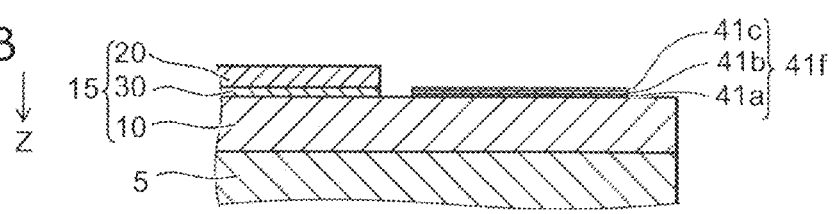

As shown in FIG. 4B, part of the second semiconductor layer 20 and part of the light emitting layer 30 are removed by etching or the like. Thereby, part of the first semiconductor layer 10 is exposed.

A layer 41f that forms the first metal layer 41 is formed on the exposed part of the first semiconductor layer 10. The layer 41f is a layer including Al and Au. In this example, the layer 41f includes a first film 41a including Al, a second film 41b including Ni, and a third film 41c including Au. For example, the first film 41a is formed on the first semiconductor layer 10. The second film 41b is formed on the first film 41a. The third film 41c is formed on the second film 41b. Thereby, a stacked film of Al/Ni/Au is formed. In the formation of the layer 41f, for example, the lift-off method using a resist or the like is used to process the layer 41f into a prescribed configuration. Also vapor deposition using a mask having an opening or the like may be used.

In the embodiment, the second film 41b of Ni is provided as necessary. In this case, for example, the third film 41c is provided on the first film 41a.

Heat treatment in an inert gas atmosphere is performed on the stacked body 15 and the layer 41f including Al and Au.

Figure 4C:
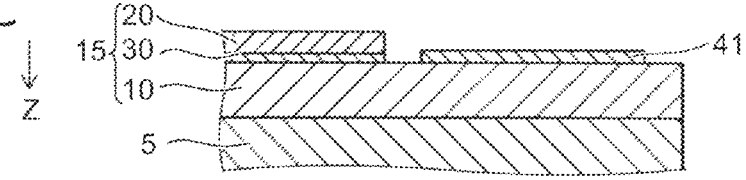

Thereby, as shown in FIG. 4C, the first metal layer 41 including an alloy including Al and Au is formed. In this example, the alloy of the first metal layer 41 includes Al, Ni, and Au.

Figure 4D:
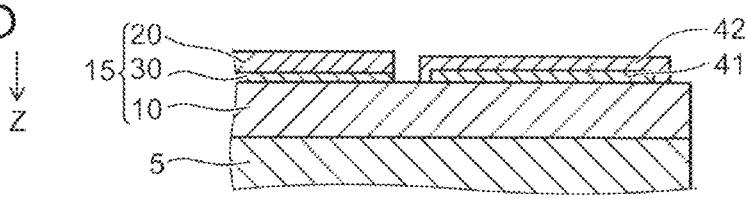

As shown in FIG. 4D, the second metal layer 42 is formed on the first metal layer 41. The second metal layer 42 includes a metal different from Al. The second metal layer 42 includes, for example, the first Ti layer 42a, the Pt layer 42b, the Au layer 42c, and the second Ti layer 42d. The second metal layer 42 covers the first metal layer 41, for example. In the formation of the second metal layer 42, for example, the lift-off method using a resist or the like is used to process the second metal layer 42 into a prescribed configuration. Also vapor deposition using a mask having an opening or the like may be used.

Figure 4E:
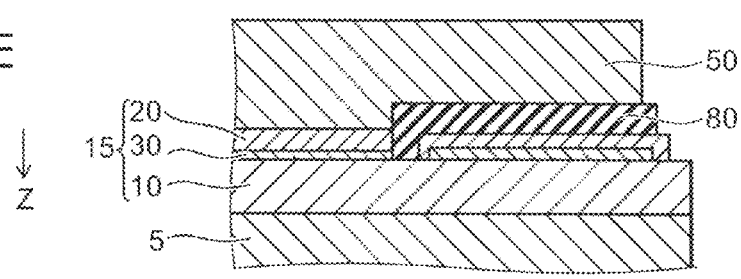

As shown in FIG. 4E, a silicon oxide film that forms the insulating layer 80 is formed on the second metal layer 42. The formation of the insulating layer 80 is performed at a temperature of, for example, 350° C. or more. Thereby, the insulating layer 80 having high insulation is obtained. CVD (chemical vapor deposition) or the like, for example, is preferably used for the formation of the insulating layer 80. Thereby, high coatability is obtained.

As shown in FIG. 4E, the counter conductive layer 50 is formed on the insulating layer 80 as necessary. The counter conductive layer 50 is electrically connected to the second semiconductor layer 20. The second semiconductor layer 20 is away from the first semiconductor layer 10, and includes a nitride semiconductor. The light emitting layer 30 is disposed between the first semiconductor layer 10 and the second semiconductor layer 20.

By applying a voltage between the second metal layer 42 and the counter conductive layer 50, a current is supplied to the light emitting layer 30 via the first semiconductor layer 10 and the second semiconductor layer 20, and light is emitted from the light emitting layer 30.

Since the insulating layer 80 formed at a temperature of 350° C. or more provides high insulation, the insulation between the counter conductive layer 50 and the first metal layer 41 and the insulation between the counter conductive layer 50 and the second metal layer 42 can be ensured.

Characteristics of the semiconductor device 110 according to the embodiment will now be described. In the following, measurement results of the optical output and the operating voltage of the semiconductor device 110 (in this example, a semiconductor light emitting device) are described.

Figure 5A:
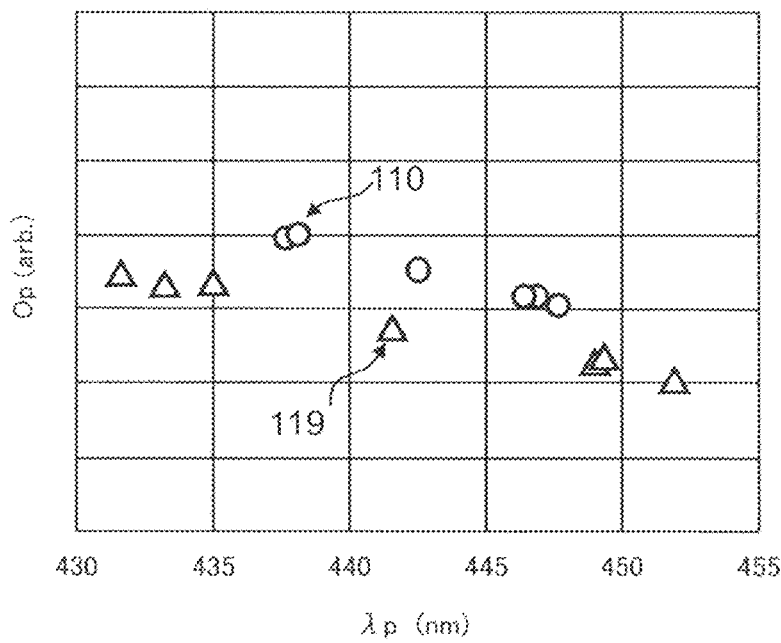
FIG. 5A and FIG. 5B are graphs showing characteristics of the semiconductor device.
Figure 5B:
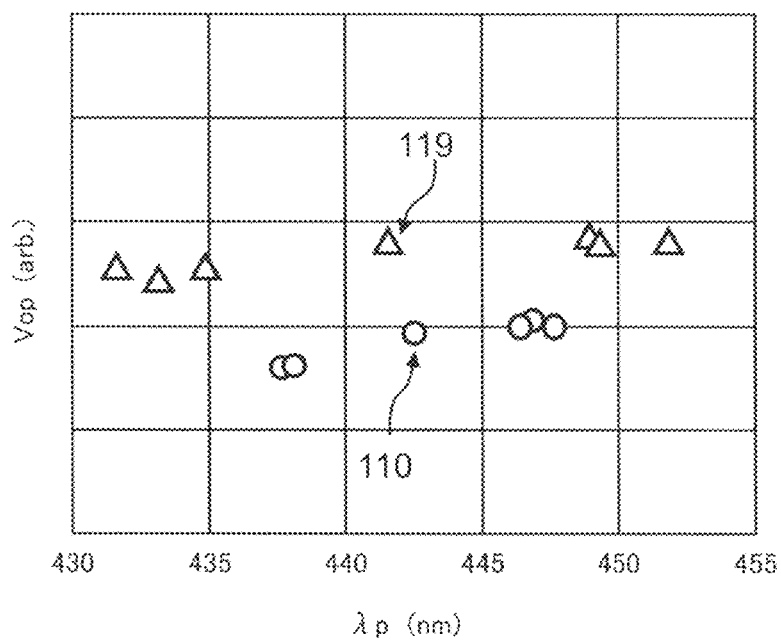

FIG. 5A and FIG. 5B are graphs illustrating characteristics of the semiconductor device.

The horizontal axis of FIG. 5A represents the peak wavelength $\lambda p$ (nm) of the emission light of the semiconductor device (in this example, a semiconductor light emitting device). The vertical axis of FIG. 5A represents the optical output Op (an arbitrary scale). The horizontal axis of FIG. 5B is the peak wavelength $\lambda p$. The vertical axis of FIG. 5B represents the operating voltage Vop (an arbitrary scale).

In the drawings, the circle mark corresponds to the semiconductor device 110 according to the embodiment. In the semiconductor device 110, an alloy including Al and Au is used for the first metal layer 41. In this example, an alloy including Al, Ni, and Au is used. The thickness of the first metal layer 41 is approximately 700 nm. As the second metal layer 42, a stacked film of the first Ti layer 42a, the Pt layer 42b, the Au layer 42c, and the second Ti layer 42d is used. The thickness of the first Ti layer 42a is approximately 50 nm. The thickness of the Pt layer 42b is approximately 50 nm. The thickness of the Au layer 42c is approximately 700 nm. The thickness of the second Ti layer 42d is approximately 50 nm.

In the drawings, the triangle mark corresponds to a semiconductor device 119 (the structure being not shown) of a reference example. In the semiconductor device 119, an Al simple substance is used for the first metal layer 41. The thickness of the first metal layer 41 is approximately 200 nm.

As can be seen from FIG. 4A, the optical output Op in the semiconductor device 110 according to the embodiment is high as compared to the semiconductor device 119 of the reference example.

As can be seen from FIG. 4B, the operating voltage Vop in the semiconductor device 110 according to the embodiment is low as compared to the semiconductor device 119 of the reference example.

Thus, good electrical characteristics are obtained in the embodiment. It is because the first metal layer 41 is substantially not degraded and the contact resistance between the first semiconductor layer 10 and the first metal layer 41 is low that a high optical output Op and a low operating voltage Vop are obtained in the embodiment. On the other hand, in the reference example, the contact resistance between the first semiconductor layer 10 and the first metal layer 41 is high.

Figure 6A:
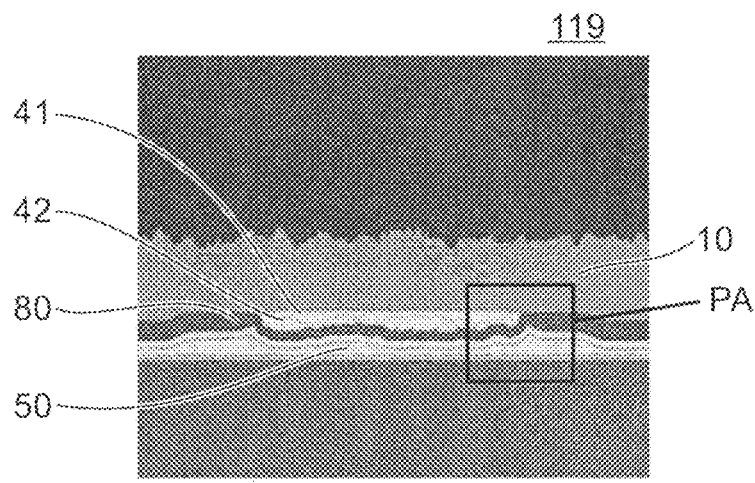
FIG. 6A and FIG. 6B are electron microscope photographic images showing a semiconductor device of the reference example.
Figure 6B:
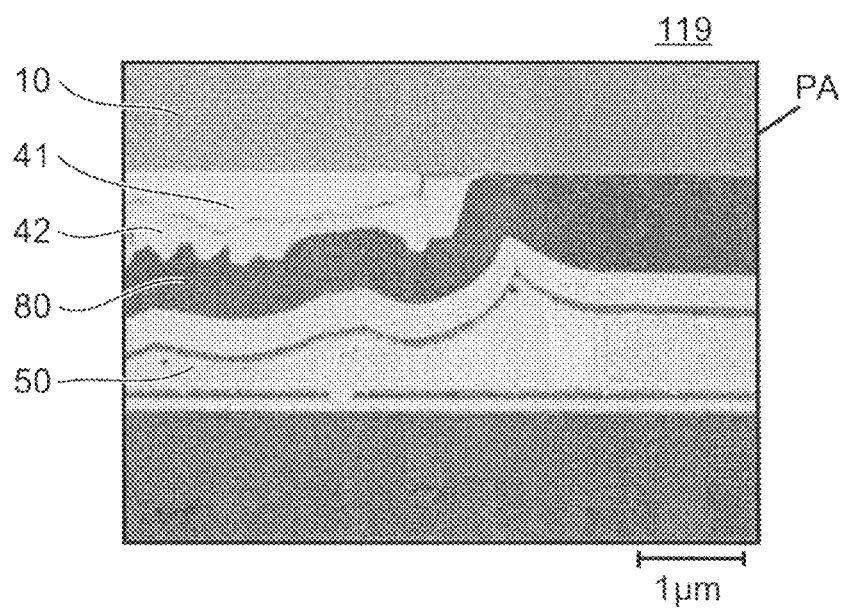

FIG. 6A and FIG. 6B are electron microscope photographic images illustrating a semiconductor device of the reference example.

FIG. 6B is an enlarged image of a part PA of FIG. 6A.

The drawings are SEM (scanning electron microscope) images of a cross section of the semiconductor device 119 using the first metal layer 41 of an Al simple substance.

As shown in FIG. 6A and FIG. 6B, the interface between the first metal layer 41 and the second metal layer 42 is uneven. Also the interface between the second metal layer 42 and the insulating layer 80 (a $SiO_2$ film) is uneven.

Although not shown, the interface between the first metal layer 41 and the second metal layer 42 is flat before the insulating layer 80 is formed. From this, it is considered that unevenness has been formed at the interface between the first metal layer 41 and the second metal layer 42 because of the formation of the insulating layer 80. In the formation of the insulating layer 80 (a $SiO_2$ film), CVD is used, and at this time a thermal history at 380° C. for 30 minutes is produced. It is considered that due to the thermal history, migration of Al of the first metal layer 41 has been caused and consequently interdiffusion has occurred between the first metal layer 41 and the second metal layer 42.

As can be seen from FIG. 6B, for example, the maximum thickness of the first metal layer 41 is approximately 600 nm. Also from the fact that the thickness of the first metal layer 41 (an Al layer) when film-formed is approximately 200 nm, it is considered that interdiffusion between the first metal layer 41 and the second metal layer 42 has occurred due to the thermal history mentioned above.

As described above, in the semiconductor device 119 of the reference example, the optical output Op is low, the operating voltage Vop is high, and the contact resistance between the first semiconductor layer 10 and the first metal layer 41 is high. It is considered that a factor in this is the interdiffusion between the first metal layer 41 and the second metal layer 42 due to the thermal history mentioned above.

In the case where, for example, lift-off including alkali treatment or the like is used for the processing of the metal layers, Al may be degraded by the alkali. It is considered that also this is a factor in the increase in the contact resistance. It is considered that by the degradation of Al due to the alkali, the interdiffusion between a metal element different from Al included in the second metal layer 42 and the Al of the first metal layer 41 is further promoted.

Thus, in the case where Al is used as an electrode in contact with the n-type first semiconductor layer 10 and a metal different from Al is formed thereon, the Al and the different metal may interact to cause an increase in the contact resistance.

Thus, good electrical characteristics are not obtained in the reference example in which an Al simple substance is used as the first metal layer 41.

On the other hand, in the embodiment in which an alloy including Al and Au is used as the first metal layer 41, the interdiffusion between the first metal layer 41 and the second metal layer 42 due to a thermal history substantially does not occur in the formation of the insulating layer 80. Furthermore, alkali resistance is improved, and also degradation due to alkali is suppressed. Consequently, the interface between the first metal layer 41 and the second metal layer 42 is flat. Also the interface between the second metal layer 42 and the insulating layer 80 is flat. It is considered that this relates to the suppression of the increase in the contact resistance between the first semiconductor layer 10 and the first metal layer 41. Consequently, a high optical output Op and a low operating voltage Vop are obtained in the embodiment.

Thus, the embodiment provides a semiconductor device having an electrode with good electrical characteristics.

A configuration may be possible in which, for example, heat treatment is performed in the case where a metal layer of an AlNi alloy is provided on the first semiconductor layer 10, a metal layer with a high melting point is provided thereon, and an Au layer is provided thereon. In this example, the separation between the AlNi layer and the Au layer is kept by the high melting point of the metal layer, and therefore an alloy including Al, Ni, and Au is not formed. In the case where an Au layer is provided directly on an AlNi alloy, alloying does not occur when heat treatment at 350° C. or more is not performed.

In the embodiment, by using a layer including Al as the first metal layer 41 in contact with the first semiconductor layer 10, high light extraction efficiency is obtained by the high reflectance of the Al.

When an Al simple substance is used for a metal layer in contact with the n-type first semiconductor layer 10 as mentioned above, the contact resistance is increased by the migration of Al or the like and the electrical characteristics are degraded as mentioned above.

On the other hand, when Au is used as a metal layer in contact with the n-type first semiconductor layer 10, the contact resistance is increased. Hence, in general, Au is not used as the metal layer in contact with the n-type first semiconductor layer 10. Thus, since the contact resistance between Au and an n-type nitride semiconductor is high, it is generally presumed that the contact resistance is high also in the case of an alloy of Au and a metal other than Au.

However, through the independent experiments described below, the inventors of this application have found that a low contact is obtained by using an alloy including Al and Au.

Figure 7:
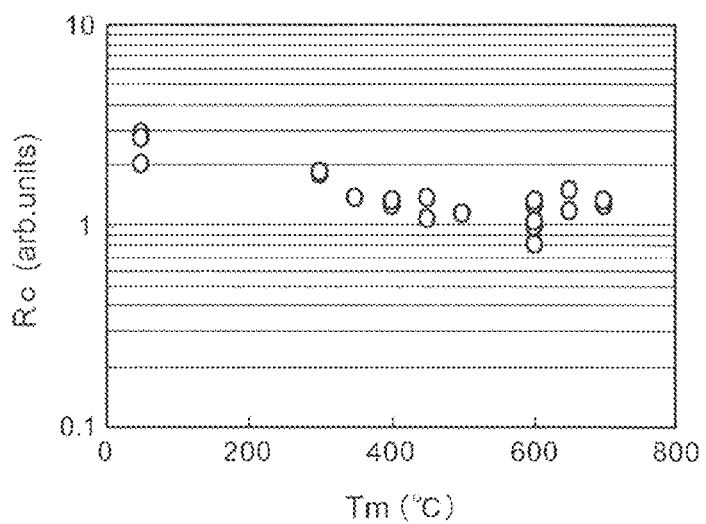
FIG. 7 is a graph showing characteristics of the semiconductor device according to the first embodiment.

FIG. 7 is a graph illustrating characteristics of the semiconductor device according to the first embodiment.

FIG. 7 shows the contact resistance when the first film 41a including Al, the second film 41b including Ni, and the third film 41c including Au were formed as the layer 41f that forms the first metal layer 41 and heat treatment (sintering treatment) was performed at different temperatures. The heat treatment is performed in a nitrogen atmosphere. The horizontal axis of FIG. 7 represents the temperature (maximum temperature) of heat treatment Tm (° C.). The vertical axis represents the contact resistance Rc (an arbitrary scale).

As shown in FIG. 7, when the temperature Tm is 50° C. (no heat treatment), the contact resistance Rc is 2 (arbitrary scale) to 3 (arbitrary scale). As the temperature of heat treatment Tm increases, the contact resistance Rc decreases. For example, when the temperature Tm is 300° C., the contact resistance Rc is approximately 1.8 (arbitrary scale). For example, when the temperature Tm is 350° C., the contact resistance Rc is approximately 1.4 (arbitrary scale). For example, when the temperature Tm is 400° C., the contact resistance Rc is approximately 1.2 (arbitrary scale). For example, when the temperature Tm is 500° C. to 600° C., the contact resistance Rc is approximately 1 (arbitrary scale).

On the other hand, it has been found that, when the temperature of heat treatment Tm is less than 400° C., the stacked film of the first film 41a, the second film 41b, and the third film 41c including Au (Al/Ni/Au) does not become an alloy. When the temperature of heat treatment Tm is 400° C. or more, the stacked film of the first film 41a, the second film 41b, and the third film 41c including Au (Al/Ni/Au) becomes an alloy, for example. This can be confirmed by observation with an optical microscope.

Thus, the layer 41f including Al and Au that forms the first metal layer 41 is formed, and heat treatment is performed to make the layer 41f into an alloy. Thereby, the first metal layer 41 is obtained. The temperature of the heat treatment is 400° C. or more. Alloying does not occur at temperatures less than 400° C.

The atmosphere of the heat treatment is preferably an inert gas atmosphere. For example, a nitrogen atmosphere is used. If, for example, heat treatment is performed in an oxygen-including atmosphere, the contact resistance is increased. A low contact resistance is obtained by heat treatment in an inert gas atmosphere.

High alkali resistance is obtained in an alloy including Al and Au.

In the embodiment, it is preferable to form a stacked film including an Al-including layer and an Au-including layer and make the stacked film into an alloy by heat treatment to form the first metal layer 41. It is also preferable to form a stacked film including an Al-including layer, a Ni-including layer, and an Au-including layer and make the stacked film into an alloy by heat treatment to form the first metal layer 41.

For example, the first metal layer 41 may be formed from an alloy including Al and Au. Also in this case, a semiconductor device having an electrode with good electrical characteristics can be provided. In the case where, for example, a stacked film including an Al-including layer and an Au-including layer is formed and the stacked film is made into an alloy by heat treatment, higher productivity is obtained and costs can be more reduced than in the case where the first metal layer 41 is formed using an alloy target.

In the case where an alloy including Al, Ni, and Au is used as the first metal layer 41, for example, the Ni composition ratio in the first metal layer 41 is allowed to vary with the position. For example, Ni may be unevenly distributed. In this case, grains may be observed in the first metal layer 41.

Figure 8A:
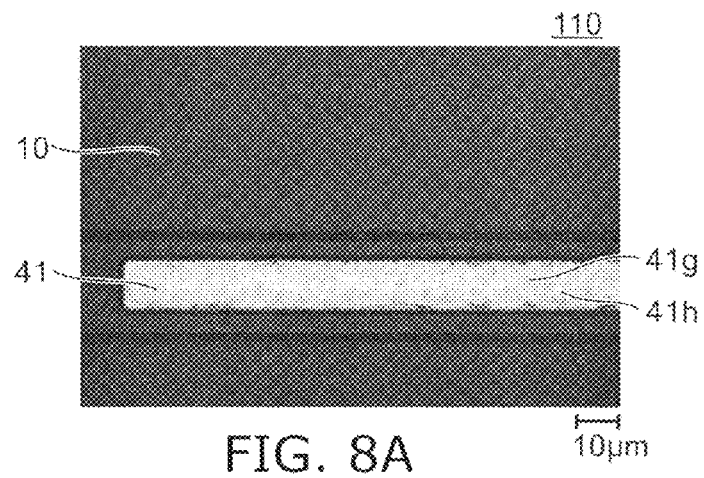
FIG. 8A and FIG. 8B are microscope photographic images showing a semiconductor device according to the first embodiment.
Figure 8B:
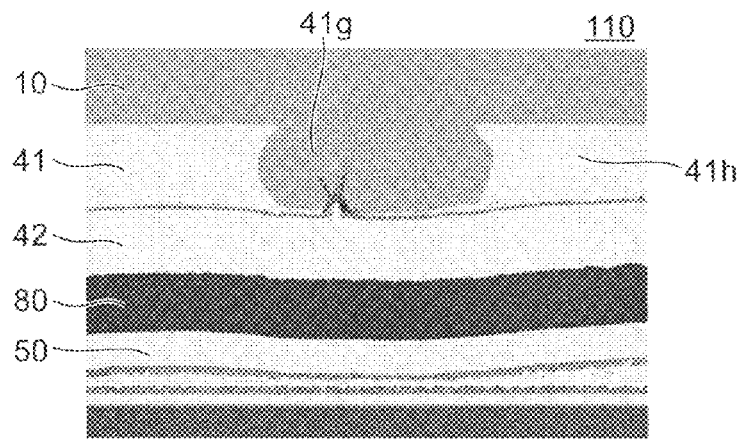

FIG. 8A and FIG. 8B are microscope photographic images illustrating a semiconductor device according to the first embodiment.

FIG. 8A is an optical microscope photographic image (a plan photograph) observed along the stacking direction. FIG. 8B is a cross-sectional SEM photographic image.

As shown in FIG. 8A, grains 41g are observed in the first metal layer 41. The grain 41g is surrounded by a surrounding portion 41h that is the other portion.

As shown in FIG. 8B, the grain 41g exists in the first metal layer 41. The grain 41g is surrounded by the surrounding portion 41h.

The following is the results of an AES (Auger electron spectroscopy) analysis of the grain 41g and the surrounding portion 41h. The grain 41g is an alloy of NiAAu. The surrounding portion 41h is an alloy of AuAl.

Thus, in the embodiment, the first metal layer 41 may include the grain 41g. The Ni composition ratio in the grain 41g is higher than the Ni composition ratio in the portion other than the grain 41g. For example, the Ni composition ratio in the grain 41g is not less than 0.4 and not more than 0.6.

The Ni composition ratio in the portion other than the grain 41g (the surrounding portion 41h) is, for example, 0.1 or less.

Thus, the alloy used for the first metal layer 41 may include Al, Au, and Ni. At this time, the ratio of Ni in the alloy is preferably not less than 0.05 and not more than 0.14, for example. The ratio of Al in the alloy is preferably not less than 0.15 and not more than 0.34. The ratio of Au in the alloy is not less than 0.55 and not more than 0.84. The total of the ratio of Ni mentioned above, the ratio of Al mentioned above, and the ratio of Au mentioned above is not more than 1. The alloy includes, for example, Al, Au, and Ni, and substantially does not include other metals. At this time, the total of the ratio of Ni mentioned above, the ratio of Al mentioned above, and the ratio of Au mentioned above is 1. However, the alloy may include a metal different from Al, Au, and Ni. The amount of the metal different from Al, Au, and Ni is small.

In the embodiment, the alloy used for the first metal layer 41 may substantially not include Ni. In this case, an alloy made of Al and Au is used for the first metal layer 41.

The experiment results for alloys made of Al and Au will now be described. In this experiment, the ratio of Al is changed in alloys made of Al and Au, and the morphology and the contact resistance (the contact resistance between the n-type first semiconductor layer 10 and the alloy) are investigated. The ratio of Al is the amount of Al to the total amount of Al and Au.

FIG. 9A to FIG. 9E are optical microscope photographic images illustrating characteristics of alloys.

Figure 9A:
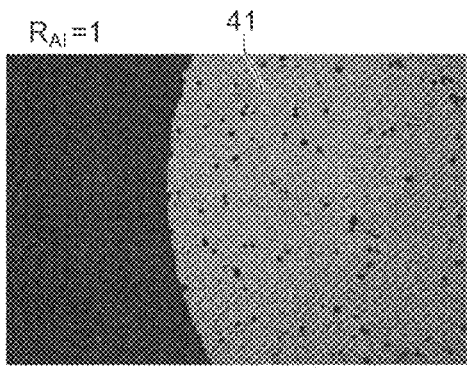
FIG. 9A to FIG. 9E are optical microscope photographic images showing characteristics of alloys.
Figure 9B:
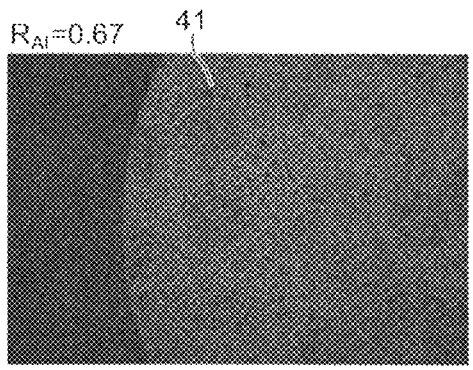
Figure 9C:
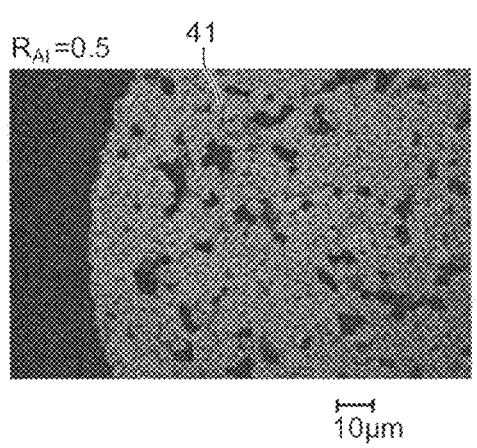
Figure 9D:
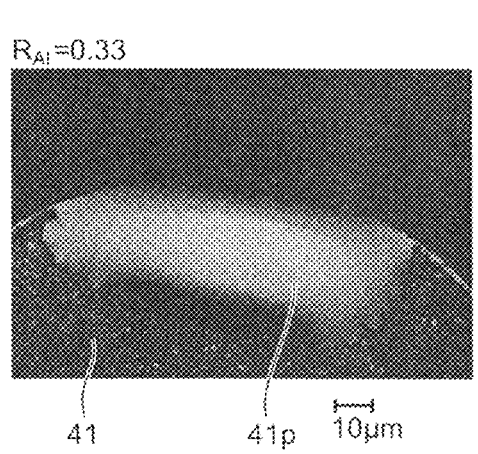
Figure 9E:
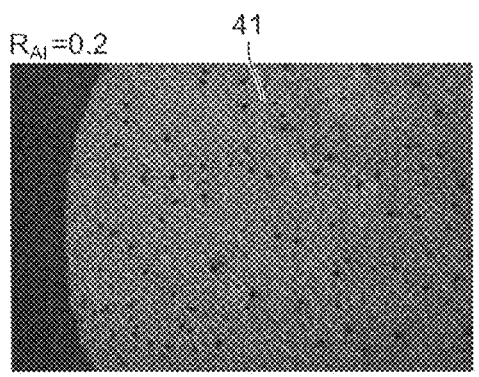

FIG. 9A corresponds to a first sample in which the ratio of Al $R_{Al}$ is 1 (an Al simple substance). FIG. 9B corresponds to a second sample in which the ratio of Al $R_{Al}$ is 0.67 (Al:Au=2:1). FIG. 9C corresponds to a third sample in which the ratio of Al $R_{Al}$ is 0.5 (Al:Au=1:1). FIG. 9D corresponds to a fourth sample in which the ratio of Al $R_{Al}$ is 0.33 (Al:Au=1:2). FIG. 9E corresponds to a fifth sample in which the ratio of Al $R_{Al}$ is 0.2 (Al:Au=1:4).

As shown in FIG. 9A, FIG. 9B, and FIG. 9E, the morphology of the alloy (the first metal layer 41) is good when the ratio of Al $R_{Al}$ is 1, 0.67, and 0.2.

As shown in FIG. 9C, when the ratio of Al $R_{Al}$ is 0.5, large grains are observed, and the morphology is not good. Furthermore, holes are formed and the surface of the first semiconductor layer 10 is exposed.

As shown in FIG. 9D, when the ratio of Al $R_{Al}$ is 0.33, an aggregate 41p of a metal is produced.

The contact resistance Rc between the first sample (the ratio of Al $R_{Al}$ being 1) and the first semiconductor layer 10 is approximately 1 (arbitrary scale).

The contact resistance Rc between the second sample (the ratio of Al $R_{Al}$ being 0.67) and the first semiconductor layer 10 is approximately 3 (arbitrary scale).

The contact resistance Rc between the third sample (the ratio of Al $R_{Al}$ being 0.5) and the first semiconductor layer 10 is approximately 2 (arbitrary scale).

The fourth sample (the ratio of Al $R_{Al}$ being 0.33) exhibits Schottky resistance characteristics to the first semiconductor layer 10.

The contact resistance Rc between the fifth sample (the ratio of Al $R_{Al}$ being 0.2) and the first semiconductor layer 10 is approximately 1 (arbitrary scale).

When the ratio of Al $R_{Al}$ is 0 (a gold simple substance), Schottky resistance characteristics are exhibited to the first semiconductor layer 10.

The second metal layer 42 was formed on such samples, and heat treatment at 380° C. for 30 minutes was performed. After that, the rate of increase in the contact resistance Rc was measured. The heat treatment was performed in an inert gas atmosphere; in this experiment, in a nitrogen atmosphere. The rate of increase in the contact resistance Rc is the ratio of the difference between the initial value before the formation of the second metal layer 42 and the heat treatment and the after-treatment value after the formation of the second metal layer 42 and the heat treatment to the initial value. The after-treatment value is larger than the initial value.

Figure 10:
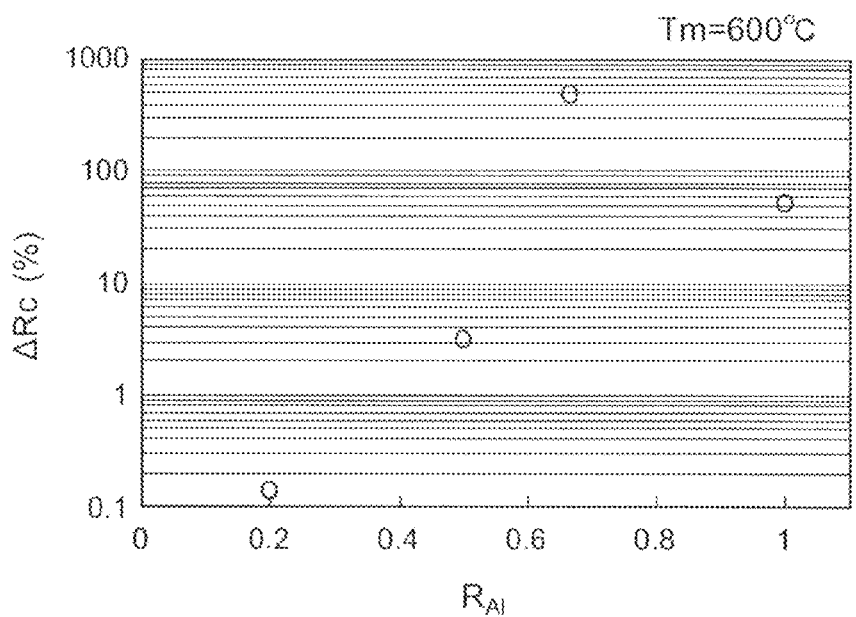
FIG. 10 is a graph showing the rate of increase in the contact resistance.

FIG. 10 is a graph illustrating the rate of increase in the contact resistance.

The horizontal axis represents the ratio of Al $R_{Al}$. The vertical axis represents the rate of increase ΔRc in the contact resistance Rc.

As shown in FIG. 10, in the first sample in which the ratio of Al $R_{Al}$ is 1 (an Al simple substance), the rate of increase ΔRc in the contact resistance Rc is approximately 50%, which is large. In the second sample in which the ratio of Al $R_{Al}$ is 0.67, the rate of increase ΔRc is approximately 500%. In the third sample in which the ratio of Al $R_{Al}$ is 0.5, the rate of increase ΔRc is approximately 3%, which is relatively small.

In contrast, in the fifth sample in which the ratio of Al $R_{Al}$ is 0.2, the rate of increase ΔRc in the contact resistance Rc is 0.1%, and the contact resistance Rc substantially does not change. That is, in the fifth sample in which the ratio of Al $R_{Al}$ is 0.2, the contact resistance Rc is approximately 1 (arbitrary scale) even after the formation of the second metal layer 42 and the heat treatment. By setting the ratio of Al $R_{Al}$ to approximately 0.2, a very low contact resistance Rc is obtained even after the formation of the second metal layer 42 and the heat treatment.

In the embodiment, in the case where the alloy used for the first metal layer 41 is made of Al and Au, the ratio of Al $R_{Al}$ in the alloy is preferably 0.24 or less. If the ratio of Al $R_{Al}$ is higher than 0.24, for example, an aggregate of a metal may be produced. If the ratio of Al $R_{Al}$ is higher than 0.24, for example, the contact resistance is increased after the formation of the second metal layer 42 and the heat treatment. By setting the ratio of Al $R_{Al}$ to 0.24 or less, an aggregate of a metal is not produced, and a low contact resistance is obtained even after the formation of the second metal layer 42 and the heat treatment.

In the case where the alloy used for the first metal layer 41 is made of Al and Au, the ratio of Al $R_{Al}$ in the alloy is preferably 0.15 or more. Thereby, for example, an aggregate of a metal is not produced, and a low contact resistance is obtained even after the formation of the second metal layer 42 and the heat treatment.

For the fifth sample in which the ratio of Al $R_{Al}$ is 0.2, the change in the contact resistance Rc when the second metal layer 42 is formed and heat treatment is performed while the temperature of the heat treatment is changed will now be described.

Figure 11:
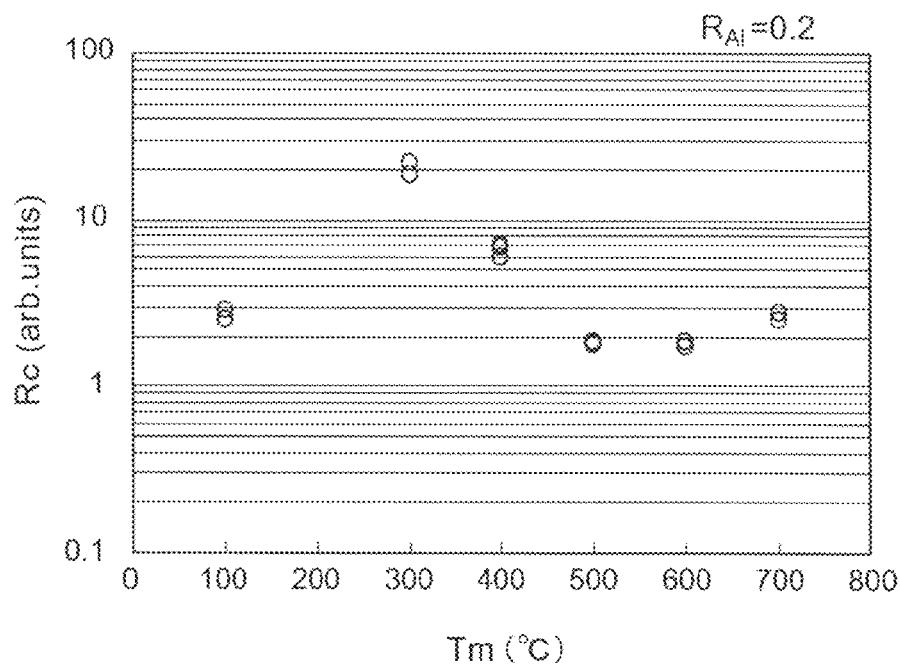
FIG. 11 is a graph showing the contact resistance.

FIG. 11 is a graph illustrating the contact resistance.

The horizontal axis of FIG. 11 represents the temperature (maximum temperature) of heat treatment Tm (° C.). The vertical axis represents the contact resistance Rc (an arbitrary unit). The heat treatment is performed in an inert gas atmosphere (in a nitrogen atmosphere).

As shown in FIG. 11, a particularly low contact resistance Rc is obtained when the temperature of heat treatment Tm is not less than 500° C. and not more than 600° C. In the embodiment, the temperature of heat treatment is preferably not less than 500° C. and not more than 600° C.

Figure 12:
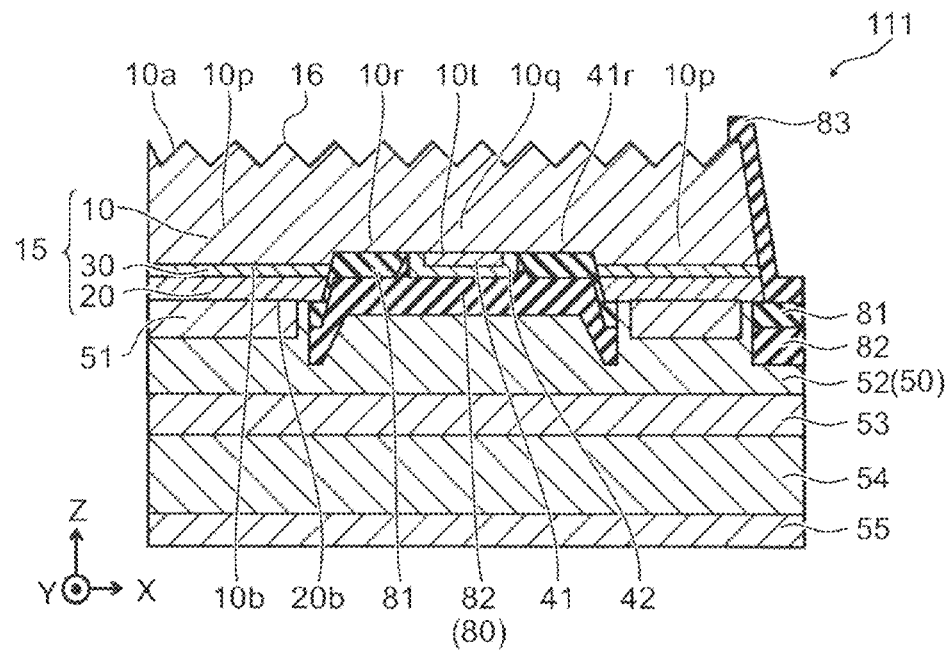
FIG. 12 and FIG. 13 are schematic cross-sectional views showing a semiconductor device according to the first embodiment.
Figure 13:
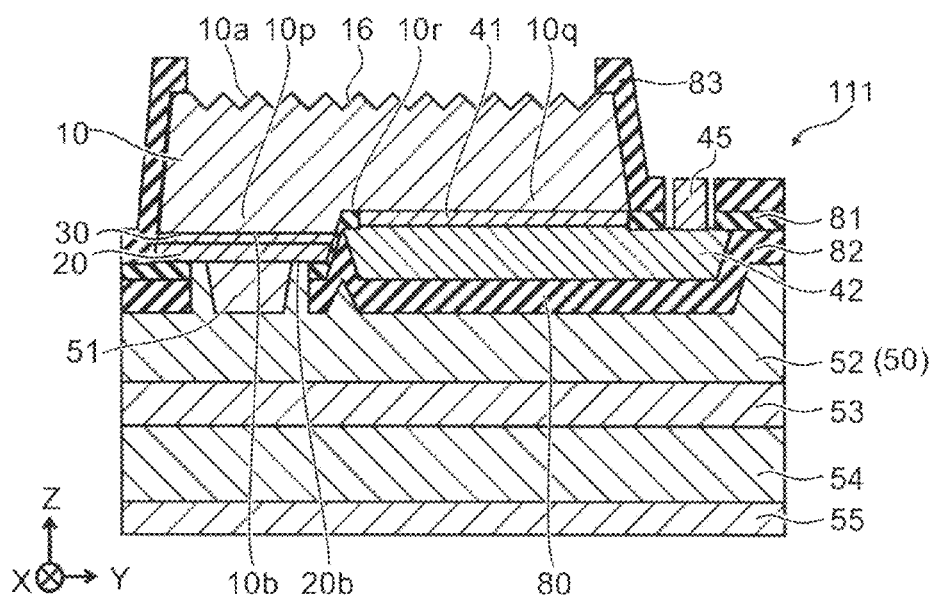

FIG. 12 and FIG. 13 are schematic cross-sectional views illustrating a semiconductor device according to the first embodiment.

Figure 14:
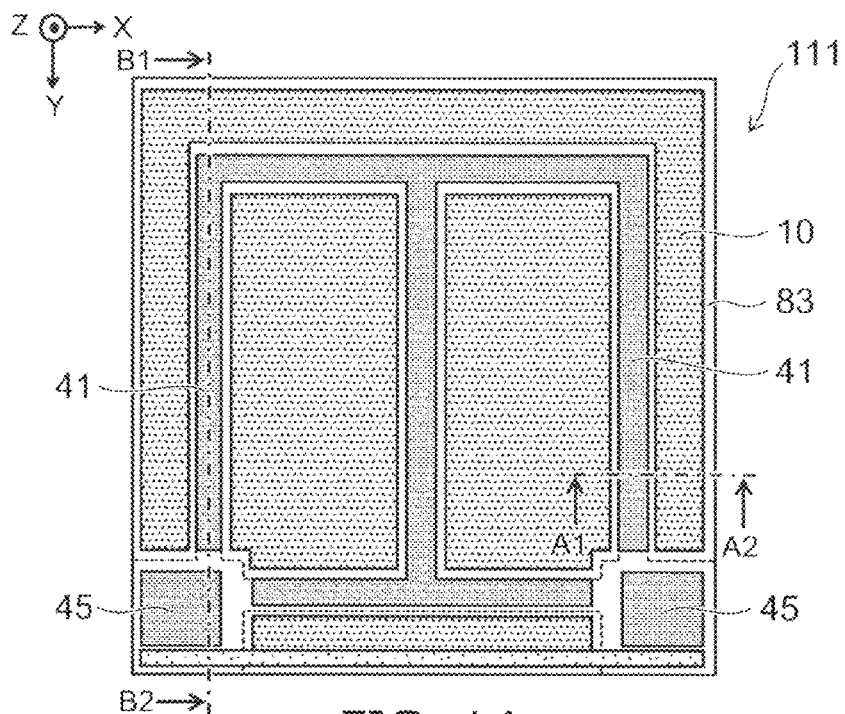
FIG. 14 is a schematic plan view showing the semiconductor device according to the first embodiment.

FIG. 14 is a schematic plan view illustrating the semiconductor device according to the first embodiment.

FIG. 12 is a cross-sectional view taken along line B1-B2 of FIG. 14. FIG. 13 is a cross-sectional view taken along line A1-A2 of FIG. 14.

As shown in FIG. 12 to FIG. 14, in another semiconductor device 111 according to the embodiment, the first metal layer 41 and the second metal layer 42 are fashioned in band shapes. The first metal layer 41 serves as a fine line electrode for spreading the current in the device plane. The second metal layer 42 electrically connects the first metal layer 41 and a pad electrode 45 described later.

The first semiconductor layer 10 has a first portion 10p and a second portion 10q. The second portion 10q is away from the first portion 10p in a direction perpendicular to the stacking direction. In this example, the first semiconductor layer 10 further includes a third portion 10r. The third portion 10r is provided between the first portion 10p and the second portion 10q in the direction perpendicular to the stacking direction A support substrate 54 is provided between a back surface electrode 55 and the first semiconductor layer 10. A bonding layer 53 is provided between the support substrate 54 and the first semiconductor layer 10. A bonding metal unit 52 is provided between the bonding layer 53 and the first semiconductor layer 10. At least part of the bonding metal unit 52 forms the counter conductive layer 50.

A p electrode 51 is provided between the first portion 10p of the first semiconductor layer 10 and the bonding metal unit 52. The second semiconductor layer 20 is provided between the first portion 10p of the first semiconductor layer 10 and the p electrode 51. The light emitting layer 30 is provided between the first portion 10p of the first semiconductor layer 10 and the second semiconductor layer 20.

A second dielectric layer 82 is provided between the second portion 10q of the first semiconductor layer 10 and the bonding metal unit 52. At least part of the second dielectric layer 82 forms the insulating layer 80. The second metal layer 42 is provided between the second portion 10q of the first semiconductor layer 10 and the second dielectric layer 82. The first metal layer 41 is provided between the second portion 10q of the first semiconductor layer 10 and the second metal layer 42. The second metal layer 42 covers the first metal layer 41. The second dielectric layer 82 covers the side surface of the second metal layer 42.

The second dielectric layer 82 extends between the third portion 10r of the first semiconductor layer 10 and the bonding metal unit 52. A first dielectric layer 81 is provided between the second portion 10q of the first semiconductor layer 10 and the second dielectric layer 82.

The first semiconductor layer 10 has a first surface 10a and a second surface 10b. The second surface 10b is a surface opposed to the light emitting layer 30 or the first metal layer 41.

The first surface 10a is a surface on the opposite side to the second surface 10b.

The first surface 10a is provided with unevenness 16. The unevenness 16 changes the travel direction of light. The depth (height) of the unevenness 16 is not less 0.5 times and not more than 5 times of the wavelength (peak wavelength) of the light emitted from the light emitting layer 30.

A pad electrode 45 is provided away from the bonding metal unit 52. The second dielectric layer 82 extends between the bonding metal unit 52 and the pad electrode 45. The pad electrode 45 is electrically connected to the second metal layer 42. A third dielectric layer 83 is provided on the side surface of the first semiconductor layer 10.

A method for manufacturing the semiconductor device 111 (a semiconductor light emitting device) thus configured will now be described.

For example, the stacked body 15 including the first semiconductor layer 10, the light emitting layer 30, and the second semiconductor layer 20 is formed on the growth substrate 5. The stacked body 15 has a p-side surface 20b. The p-side surface 20b is a surface on the second semiconductor layer 20 side of the stacked body 15.

Part of the second semiconductor layer 20 and part of the light emitting layer 30 are removed by dry etching or the like to form a recess 10t. Part of the first semiconductor layer 10 is exposed in the recess 10t. As described later, the first metal layer 41 and the second metal layer 42 are formed in the recess 10t. The recess 10t is shaped like, for example, a trench with a width of approximately 25 μm. In the formation of the recess 10t, a recess for a pad (not shown) is formed in the position where the pad electrode 45 described later will be formed. The recess for a pad is, for example, a quadrangle with a length of one side of approximately 130 μm.

A $SiO_2$ layer that forms the first dielectric layer 81 is formed on the p-side surface 20b. The thickness of the first dielectric layer 81 is approximately 400 nm.

A portion in the recess 10t of the first dielectric layer 81 is etched to be removed along the shape of the recess 10t. The width of the first dielectric layer 81 to be removed is, for example, approximately 25 μm. The first semiconductor layer 10 is exposed in the portion where the first dielectric layer 81 has been removed.

A stacked film of Al/Ni/Au that forms the first metal layer 41 is formed on the exposed first semiconductor layer 10. The thickness of the stacked film of Al/Ni/Au is, for example, approximately 700 nm. The lift-off method or the like, for example, is used in the formation of the Al/Ni/Au stacked film.

The stacked film of Al/Ni/Au is heat-treated (sintering-treated) at a temperature of not less than 400° C. and not more than 900° C. in a nitrogen atmosphere for approximately 1 minute (e.g. not less than 30 seconds and not more than 5 minutes). Thereby, an alloy of AlNiAu is obtained. The width of the first metal layer 41 is, for example, approximately 20 μm.

A stacked film of Ti/Pt/Au/Ti that forms the second metal layer 42 is formed on the first metal layer 41 and the first dielectric layer 81. The thickness of the stacked film of Ti/Pt/Au/Ti is, for example, approximately 700 nm. The lift-off method or the like, for example, is used in the formation of the stacked film of Ti/Pt/Au/Ti.

A $SiO_2$ layer that forms the second dielectric layer 82 is formed on the p-side surface 20b. The thickness of the second dielectric layer 82 is, for example, approximately 600 nm. The formation of the second dielectric layer 82 is performed at 350° C. or more. Thereby, high insulation is obtained. The CVD method, for example, is used for the formation of the second dielectric layer 82. Thereby, high coatability is obtained.

Part of the first dielectric layer 81 and part of the second dielectric layer 82 on the second semiconductor layer 20 are removed by wet etching or the like. On the second semiconductor layer 20 thus exposed, an Ag film is formed with a thickness of 200 nm. Sintering for approximately 1 minute is performed at a temperature of 400° C. in an oxygen atmosphere to form the p electrode 51.

A stacked film of, for example, Ti/Pt/Au that forms the bonding metal unit 52 is formed on the entire p-side surface 20b. The thickness of the stacked film of Ti/Pt/Au is, for example, approximately 800 nm.

The support substrate 54 is prepared. A silicon substrate, for example is used as the support substrate 54. The bonding layer 53 is provided on the major surface of the support substrate 54. The bonding layer 53 includes, for example, a solder including an AuSn alloy. The thickness of the bonding layer 53 is, for example, approximately 3 μm.

The bonding metal unit 52 and the bonding layer 53 are opposed to each other, and heating is performed. The temperature of the heating is, for example, 300° C. This temperature is a temperature not less than the eutectic point of the solder. Thereby, the support substrate 54 and the stacked body 15 are bonded together.

Laser light is applied to the stacked body 15 from the side of the growth substrate 5, for example. The third harmonic (355 nm) or the fourth harmonic (266 nm) of a solid-state laser of $YVO_4$, for example, is used as the laser light. Thereby, GaN included in the stacked body 15 is decomposed near the interface between the growth substrate 5 and the stacked body 15. Ga and N are generated from the GaN. The decomposed Ga is removed by hydrochloric acid treatment or the like to peel off the growth substrate 5 from the stacked body 15. Thereby, the growth substrate 5 and the stacked body 15 are separated.

Dry etching is performed on the entire stacked body 15 to expose the first semiconductor layer 10. At this time, for example, the etching amount is adjusted so that the thickness of the first semiconductor layer 10 may become 4 μm.

Part of the stacked body 15 is removed by dry etching using a resist mask or a dielectric mask. Part of the first dielectric layer 81 that has been in contact with the stacked body 15 is exposed. The region to be exposed includes a region overlapping on the second metal layer 42 for connection to the pad electrode 45.

A $SiO_2$ layer that forms the third dielectric layer 83 is formed on the stacked body 15 and the exposed first dielectric layer 81. An opening is formed in part of the $SiO_2$ layer. Thereby, the third dielectric layer 83 is formed. The thickness of the third dielectric layer 83 is, for example, approximately 600 nm. Part of the surface of the first semiconductor layer 10 is exposed from the opening of the third dielectric layer 83.

The third dielectric layer 83 having the opening is used as a mask to form unevenness 16 on the surface of the first semiconductor layer 10. For this formation, for example, processing by alkaline etching with a KOH solution is used. In the etching processing, for example, a 1 mol/L KOH solution is used, the processing temperature is 80° C., and the processing time is approximately 20 minutes.

The third dielectric layer 83 and the first dielectric layer 81 on the second metal layer 42 are removed by wet etching or the like. A stacked film of, for example, Ti/Pt/Au that forms the pad electrode 45 is formed on the exposed second metal layer 42. The thickness of the stacked film of Ti/Pt/Au is, for example, approximately 500 nm. A bonding wire, for example, is connected to the pad electrode 45. Alternatively, a conductive ball or the like for connection may be connected.

The support substrate 54 is scraped off by grinding or the like, for example. The thickness of the support substrate 54 is made, for example, approximately 100 μm. A stacked film of, for example, Ti/Pt/Au is formed as the back surface electrode 55 on the ground surface. The thickness of the stacked film of Ti/Pt/Au is, for example, 800 nm. The back surface electrode 55 is connected to, for example, a heat sink or a package The support substrate 54 is cut by cleaving, using a diamond blade, or the like as necessary. Thus, the semiconductor device 111 is completed.

In the semiconductor device 111, an alloy including Al and Au is used as the first metal layer 41 in contact with the n-type first semiconductor layer 10; thereby, good electrical characteristics (e.g. a low contact resistance) are obtained.

Second Embodiment

The embodiment relates to a method for manufacturing a semiconductor device.

Figure 15:
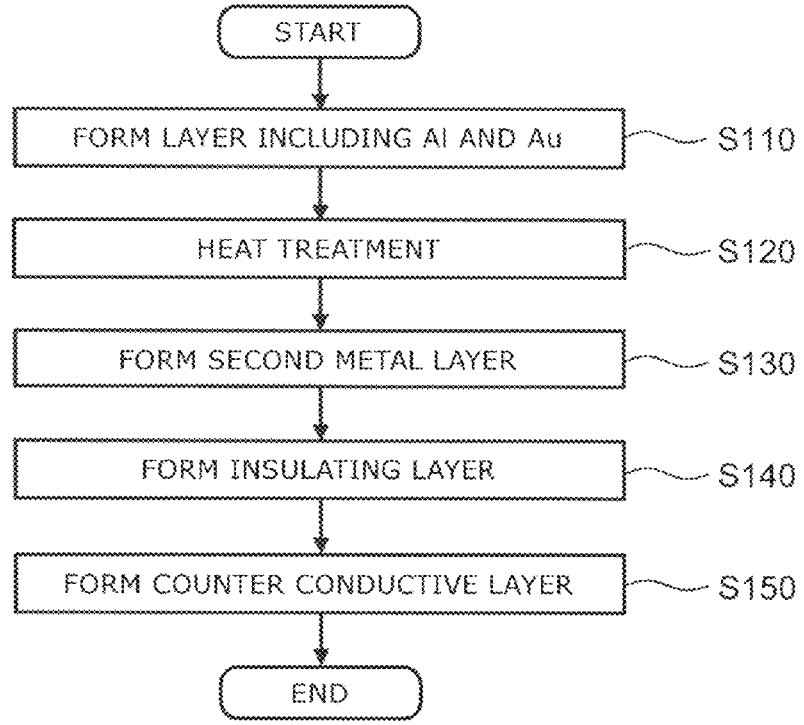
FIG. 15 is a flow chart showing a method for manufacturing a semiconductor device according to a second embodiment.

FIG. 15 is a flow chart illustrating a method for manufacturing a semiconductor device according to a second embodiment.

As shown in FIG. 15, the manufacturing method includes forming the layer 41f including Al and Au in contact with the n-type first semiconductor layer 10 including a nitride semiconductor (step S110).

The manufacturing method further includes performing heat treatment in an inert gas atmosphere on the first semiconductor layer 10 and the layer 41f including Al and Au to form the first metal layer 41 including an alloy including Al and Au (step S120).

The manufacturing method further includes forming the second metal layer 42 including a metal different from Al on the first metal layer 41. The manufacturing method further includes forming the insulating layer 80 at a temperature of 350° C. or more on the second metal layer 42.

In the manufacturing method, for example, the processing described in regard to FIG. 4A to FIG. 4E is performed.

The manufacturing method can provide a method for manufacturing a semiconductor device having an electrode with good electrical characteristics.

The manufacturing method may further include forming the counter conductive layer 50 on the insulating layer 80. The counter conductive layer 50 is electrically connected to the p-type second semiconductor layer 20, which is away from the first semiconductor layer 10 and includes a nitride semiconductor. At this time, the light emitting layer 30 is disposed between the first semiconductor layer 10 and the second semiconductor layer 20.

In the embodiment, the heat treatment in an inert gas atmosphere preferably includes heat treatment at a temperature of not less than 400° C. and not more than 900° C. The heat treatment in an inert gas atmosphere more preferably includes heat treatment at a temperature of not less than 500° C. and not more than 600° C. The inert gas preferably includes nitrogen.

The insulating layer 80 includes, for example, silicon oxide. Thereby, high insulation is obtained.

The formation of the second metal layer 42 includes, for example, forming the first Ti layer 42a on the first metal layer 41, forming the Pt layer 42b on the first Ti layer 42a, and forming the Au layer 42c on the Pt layer 42b. The formation of the second metal layer 42 may further include, for example, forming the second Ti layer 42d on the Au layer 42c.

In the embodiment, for the growth of the semiconductor layers, for example, the metal-organic chemical vapor deposition (MOCVD) method, the metal-organic vapor phase epitaxy (MOVPE) method, the molecular beam epitaxy (MBE) method, the halide vapor phase epitaxy (HVPE) method, etc. may be used.

For example, in the case where the MOCVD method or the MOVPE method is used, the following may be used as the source material in the formation of the semiconductor layers. As the source material of Ga, for example, TMGa (trimethylgallium) and TEGa (triethylgallium) may be used. As the source material of In, for example, TMIn (trimethylindium), TEIn (triethylindium), and the like may be used. As the source material of Al, for example, TMAl (trimethylaluminum) and the like may be used. As the source material of N, for example, $NH_3$ (ammonia), MMHy (monomethylhydrazine), DMHy (dimethylhydrazine), and the like may be used.

As the source material of the impurity, for example, the following may be used. As the source gas of Si, for example, silane ($SiH_4$) may be used. As the source material of Mg, for example, biscyclopentadienylmagnesium ($Cp_2Mg$) may be used. As the source material of Mn, for example, tricarbonylmanganese (MMT) may be used. As the source material of Fe, for example, iron carbonyl ($Fe(CO)_5$) and ferrocene ($Cp_2Fe$) may be used.

The embodiment provides a semiconductor device having an electrode with good electrical characteristics and a method for manufacturing the same.

In the specification, "nitride semiconductor" includes all semiconductors expressed by the chemical formula of $B_xIn_yAl_zGa_{1-x-y-z}N$ ($0 \leq x \leq 1$, $0 \leq y \leq 1$, $0 \leq z \leq 1$, $x+y+z \leq 1$) in which the composition ratios x, y, and z are changed in the respective ranges. Furthermore, in the chemical formula mentioned above, also those further including a group V element other than N (nitrogen), those further including various elements added in order to control various properties such as the conductivity type, and those further including various elements unintentionally included are included in the "nitride semiconductor."

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the embodiment of the invention is not limited to these specific examples. For example, one skilled in the art may appropriately select specific configurations of components of semiconductor devices such as first semiconductor layers, second semiconductor layers, light emitting layers, first metal layers, second metal layers, insulating layers, and counter conductive layers from known art and similarly practice the invention. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices, and methods for manufacturing semiconductor devices practicable by an appropriate design modification by one skilled in the art based on the semiconductor devices, and the methods for manufacturing semiconductor devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
    a first semiconductor layer of an n type including a nitride semiconductor;
    a first metal layer of an alloy containing Al, Au and Ni, the first metal layer being in contact with the first semiconductor layer;
    a second metal layer in contact with the first metal layer, the second metal layer including a metal different from Al, the first metal layer being disposed between the second metal layer and the first semiconductor layer,
    wherein a ratio of Ni in the alloy is not less than 0.05 and not more than 0.14,
    a ratio of Al in the alloy is not less than 0.14 and not more than 0.34,
    a ratio of Au in the alloy is not less than 0.55 and not more than 0.84, and
    a total of the ratio of the Ni, the ratio of the Al, and the ratio of the Au is 1.

2. The device according to claim 1, further comprising:
    a second semiconductor layer including a nitride semiconductor; and
    a light emitting layer provided between the first semiconductor layer and the second semiconductor layer.

3. The device according to claim 2, further comprising an insulating layer, at least one of the first metal layer and the second metal layer being disposed between the insulating layer and the first semiconductor layer.

4. The device according to claim 3, further comprising a counter conductive layer electrically connected to the second semiconductor layer,
    at least a part of the insulating layer being disposed between the counter conductive layer and the second metal layer and electrically insulating the counter conductive layer and the second metal layer.

5. The device according to claim 3, wherein the insulating layer includes silicon oxide.

6. The device according to claim 5, wherein a refractive index of the insulating layer is not less than 1.45 and less than 2.00.

7. The device according to claim 1, wherein the second metal layer includes
    an Au layer,
    a Pt layer provided between the Au layer and the first metal layer, the Pt layer being in contact with the Au layer, and
    a first Ti layer provided between the Pt layer and the first metal layer, the first Ti layer being in contact with the Pt layer and the first metal layer.

8. The device according to claim 7, wherein
    the second metal layer further includes a second Ti layer in contact with the Au layer, and
    the Au layer is disposed between the second Ti layer and the Pt layer.

9. A semiconductor device comprising:
    a first semiconductor layer of an n type including a nitride semiconductor;
    a first metal layer of an alloy made of Al and Au, the first metal layer being in contact with the first semiconductor layer;
    a second metal layer in contact with the first metal layer, the second metal layer including a metal different from Al, the first metal layer being disposed between the second metal layer and the first semiconductor layer,
    a ratio of Al in the alloy is not less than 0.15 and not more than 0.24, and
    a total of the ratio of the Al and the ratio of the Au is 1.

10. The device according to claim 9, further comprising:
    a second semiconductor layer including a nitride semiconductor; and
    a light emitting layer provided between the first semiconductor layer and the second semiconductor layer.

11. The device according to claim 10, further comprising an insulating layer, at least one of the first metal layer and the second metal layer being disposed between the insulating layer and the first semiconductor layer.

12. The device according to claim 11, further comprising a counter conductive layer electrically connected to the second semiconductor layer,
    at least a part of the insulating layer being disposed between the counter conductive layer and the second metal layer and electrically insulating the counter conductive layer and the second metal layer.

13. The device according to claim 11, wherein the insulating layer includes silicon oxide.

14. The device according to claim 13, wherein a refractive index of the insulating layer is not less than 1.45 and less than 2.00.

15. The device according to claim 9, wherein the second metal layer includes
    an Au layer,
    a Pt layer provided between the Au layer and the first metal layer, the Pt layer being in contact with the Au layer, and
    a first Ti layer provided between the Pt layer and the first metal layer, the first Ti layer being in contact with the Pt layer and the first metal layer.

16. The device according to claim 15, wherein
    the second metal layer further includes a second Ti layer in contact with the Au layer, and
    the Au layer is disposed between the second Ti layer and the Pt layer.

* * * * *